United States Patent [19]
Baba

[11] Patent Number: 5,977,592
[45] Date of Patent: Nov. 2, 1999

[54] SEMICONDUCTOR DEVICE HAVING AN IMPROVED STRUCTURE AND CAPABLE OF GREATLY REDUCING ITS OCCUPIED AREA

[75] Inventor: Shunsuke Baba, Tokyo, Japan

[73] Assignee: Oki Electric Industry Co., Ltd., Tokyo, Japan

[21] Appl. No.: 08/925,091

[22] Filed: Sep. 8, 1997

[30] Foreign Application Priority Data

Jan. 31, 1997 [JP] Japan .................................. 9-033074

[51] Int. Cl.$^6$ .................................................. H01L 29/00
[52] U.S. Cl. .......................... 257/355; 257/357; 257/371
[58] Field of Search ................................... 257/355, 357, 257/360, 371

[56] References Cited

U.S. PATENT DOCUMENTS

| 5,355,006 | 10/1994 | Iguchi | 257/296 |
| 5,581,103 | 12/1996 | Mizukami | 257/355 |
| 5,670,814 | 9/1997 | Wu et al. | 257/360 |
| 5,689,132 | 11/1997 | Ichikawa | 257/357 |
| 5,734,186 | 3/1998 | Honnigford et al. | 257/360 |

FOREIGN PATENT DOCUMENTS

| 0055411 | 7/1982 | European Pat. Off. . |
| 0305975 | 3/1989 | European Pat. Off. . |
| 2 049 273 | 12/1980 | United Kingdom . |
| 2285884 | 7/1995 | United Kingdom . |

OTHER PUBLICATIONS

Patent Abstracts of Japan, vol. 013, No. 068 (E–716), Feb. 16, 1989 & JP 63 252464 A (Mitsubishi Electric Corp), Oct. 19, 1988.

Patent Abstracts of Japan, vol. 005, No. 034 (E–048), Mar. 4, 1981 & JP 55 162270 A (Sharp Corp), Dec. 17, 1980.

*Primary Examiner*—Valencia Martin-Wallace
*Attorney, Agent, or Firm*—Jones, Volentine, Steinberg & Whitt, L.L.P.

[57] ABSTRACT

A semiconductor device includes a source and a drain formed in a device region of a semiconductor substrate, and an electrode withdrawal portion having an impurity concentration higher than that of the device region. The electrode withdrawal portion is formed so as to adjoin either one of the source and drain. An electrode for the source or drain adjacent to the electrode withdrawal portion is used jointly as an electrode for the electrode withdrawal portion.

3 Claims, 5 Drawing Sheets

SEMICONDUCTOR DEVICE HAVING AN IMPROVED STRUCTURE AND CAPABLE OF GREATLY REDUCING ITS OCCUPIED AREA

BACKGROUND OF THE INVENTION

1. Field of the Invention

This invention relates to a semiconductor device such as a MOS transistor or the like and a method of manufacturing it, and particularly to a compact semiconductor device and a method of manufacturing it.

2. Description of the Related Art

In a MOS transistor, a drain current that flows between a source and a drain thereof formed in a semiconductor substrate, is controlled according to the value of a gate voltage corresponding to a voltage applied to a gate formed in relation to the source and drain thereof.

A threshold voltage of the gate, which allows the drain current, varies according to a potential applied to the semiconductor substrate. Thus, in order to control the potential of the semiconductor substrate, an electrode drawing or withdrawal portion used for an element or device region is formed in the device region for the MOS transistor, in which the source and drain are formed. A substrate electrode is provided at the electrode withdrawal portion independent of respective electrodes for the source and drain.

In order to obtain an ohmic contact between the substrate electrode and a device region for the semiconductor substrate, the electrode withdrawal portion is supplied with an impurity concentration higher than that of the device region by an impurity of the same conduction type as in the device region.

When the MOS transistor is now used as a digital circuit component such as an inverter or the like, it is necessary to maintain the potential of the semiconductor substrate, i.e., a potential applied to a well when the MOS transistor is formed in the well corresponding to the device region for the semiconductor substrate, for example, at a predetermined value.

Therefore, the substrate electrode provided at the electrode withdrawal portion for the device region is electrically connected to either one of the source and drain electrodes by an external interconnection to hold the substrate electrode at the same potential as that applied to the source or drain electrode.

SUMMARY OF THE INVENTION

Therefore, the conventional MOS transistor described above is provided with the substrate electrode independent of the source and drain electrodes and supplied with the substrate potential by the external interconnection even when the potential of the device region is used at the same potential as that applied to the source or drain thereof. As a result, the conventional semiconductor device requires a relatively large device area for the separate substrate electrode. Thus, a semiconductor device capable of achieving its more compactness and a method of manufacturing it have been long-excepted from this point of view.

The present invention adopts the following constructions to solve the foregoing.

A semiconductor device according to the present invention comprises a source and a drain formed in a device region of a semiconductor substrate, the source and drain being subjected to control on a current flowing therebetween by a gate voltage and being provided with electrodes respectively; and an electrode withdrawal portion for the device region, which is formed in the device region so as to adjoin either one of the source and drain and has an impurity concentration higher than that of the device region, the electrode attached to either one of the source and drain, which is adjacent to the electrode withdrawal portion, is used jointly as an electrode for the electrode withdrawal portion.

In the semiconductor device according to the present invention, since the electrode for the electrode withdrawal portion in the device region is placed in common use with either one of the electrodes for the source and drain, which is adjacent to the electrode withdrawal portion, a potential applied to the device region can be held at a potential identical to that applied to either the source or drain.

Thus, according to the present invention, since the need for the substrate electrode used for the device region, which is independent of the respective electrodes for the source or drain, is eliminated, the device region can be reduced in size owing to its elimination. Thus, the semiconductor device can be rendered compact in size.

Further, a method of manufacturing a semiconductor device, according to the present invention is the above-described semiconductor device manufacturing method and comprises the following steps of:

forming a mask having an opening defined in a device region of a semiconductor substrate;

implanting impurities into one half and the other half of the surface of the device region, which is exposed to the opening, from reverse-slanting directions as viewed from the opposed sides of opening edges above the opening of the mask, by ion implantation, thereby forming impurity-implanted regions for the electrode withdrawal portion and the source or drain in the device region so as to adjoin each other; and forming an electrode adjoining the two impurity-implanted regions adjacent to each other on the device region.

In the method of manufacturing the semiconductor device, according to the present invention, since the impurity-implanted region for the electrode withdrawal portion of the device region and the impurity-implanted region for the source or drain adjacent thereto are formed by ion implantation made from the slanting directions opposed to each other, using the single mask having the opening defined in the device region of the semiconductor substrate, the electrode withdrawal portion and the source or drain adjacent thereto can be easily and efficiently formed by heat treatment used for activation of impurities in the impurity-implanted regions.

Thus, according to the present invention, the semiconductor device according to the present invention can be fabricated at low cost and with comparatively ease and efficiency.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 2(a) and 2(b) are manufacturing process drawings showing some of a method of manufacturing the transistor structure according to the present invention, in which FIG. 2(a) is a cross-sectional view showing an ion implanting process used for a drain, and FIG. 2(b) is a cross-sectional view illustrating an ion implanting process used for a source and an electrode withdrawal portion;

FIG. 5 is a circuit diagram of the CMOS inverter shown in FIG. 4, wherein

DETAILED DESCRIPTION OF THE PREFERRED EMBODIMENTS

The present invention will hereinafter be described in detail by preferred embodiments illustrated in the accompanying drawings.

Figure 1:
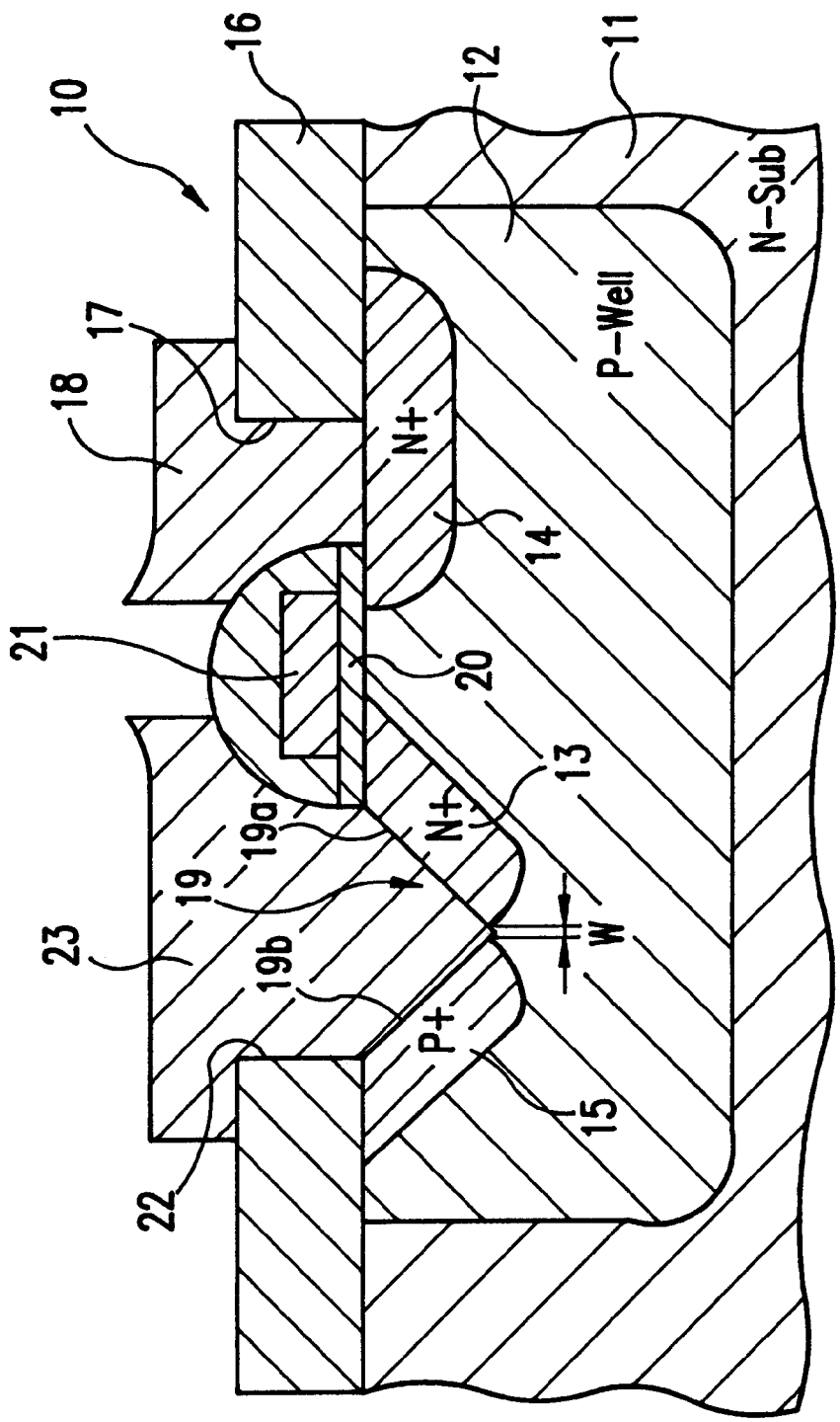
FIG. 1 is a partially longitudinal cross-sectional view showing a transistor structure according to the present invention.

FIG. 1 shows an embodiment in which the present invention is applied to a semiconductor device 10 comprised of an NMOS transistor.

In the embodiment illustrated in FIG. 1, the NMOS transistor 10 is formed in a P well 12 formed in a semiconductor substrate 11 composed of N-type silicon with the P well 12 as an element or device region.

The P well 12 includes a source 13 and a drain 14 each composed of an $N^+$ diffusion region (impurity region) having an impurity concentration higher than an impurity concentration of the semiconductor substrate 11, and an electrode drawing or withdrawal portion 15 composed of a $P^+$ diffusion region having an impurity concentration higher than an impurity concentration of the P well 12.

In the embodiment illustrated in FIG. 1, the drain 14 is formed with a portion thereof exposed on a flat surface of the semiconductor substrate 11 in a manner similar to the conventional MOS transistor. The drain 14 is electrically connected to a drain electrode 18 through a contact hole 17 defined in an insulating film 16 composed of, for example, silicon oxide, for covering the surface of the semiconductor substrate 11.

On the other hand, the source 13 is formed in a slanted region which extends along a peripheral wall portion 19a of a concave portion 19 having a rectangular transverse sectional configuration formed in the semiconductor substrate 11 and taking a pyramid as a whole. Further, the source 13 extends to the surface of the semiconductor substrate 11. A gate 21 corresponding to a control electrode is formed between the source 13 and drain 14 of the surface of the semiconductor substrate 11 with a gate oxide film 20 interposed therebetween as is well known previously.

Further, the electrode withdrawal portion 15 is formed along a peripheral wall portion 19b located on the side opposite to the peripheral wall portion 19a of the concave portion 19. The electrode withdrawal portion 15 and the source 13 are disposed so as to be adjacent to each other in relation to the concave portion 19. Further, the electrode withdrawal portion 15 and the source 13 are formed with an interval W interposed therebetween at the bottom of the concave portion 19. The interval W may preferably be less than or equal to, for example, $0.5\mu m$ corresponding to such an extent that a parasitic resistance to be described later between the source 13 and the electrode withdrawal portion 15 is not substantially created, from the viewpoint of a reduction in the parasitic resistance. In order to render the NMOS transistor 10 compact in size, the interval W can be set to a value smaller than $2\mu m$, preferably zero.

A contact hole 22, which is open to or in communication with the concave portion 19, is defined in the insulating film 16. The source 13 and he electrode withdrawal portion 15 are connected to a jointly type or combined electrode 23 corresponding to a conductive layer through the contact hole 22.

Since the electrode withdrawal portion 15 is formed of a P-type impurity region identical in type to the P well 12 and an impurity concentration thereof is higher than that of the P well 12, a suitable ohmic contact is obtained between the combined electrode 23 and the P well 12 when a predetermined drain voltage is applied between the combined electrode 23 and the drain electrode 18 with the combined electrode 23 as a source electrode.

By controlling the voltage applied to the gate 21 in a state in which the predetermined drain voltage is applied between the drain electrode 18 and the combined electrode 23, the NMOS transistor 10 can control intermittence of a drain current between the source 13 and the drain 14 as is well known previously.

Since the P well 12 is held at a potential applied to the source 13 through the combined electrode 23 connected to the electrode withdrawal portion 15, it is possible to reliably prevent the threshold value of the gate 21 from varying due to a variation in the potential of the P well 12 corresponding to the device region.

Thus, according to the semiconductor device 10 of the present invention, the potential of the device region can be maintained at a predetermined value without forming the conventionally-used electrode dedicated to the electrode withdrawal portion and hence a satisfactory switching operation providing a stable threshold value can be obtained. Since the electrode dedicated to the electrode withdrawal portion becomes unnecessary owing to the adoption of the combined electrode 23, the area of the P well 12 corresponding to the device region can be reduced. Thus, the semiconductor device 10 can be compacted.

Further, the neighboring placement of the source 13 and the electrode withdrawal portion 15 allows the prevention of a parasitic resistance developed in proportion to the distance between the two and a voltage drop developed across the parasitic resistance and permits the reliable prevention of a variation in the potential of the device region 12 due to the voltage drop. Since the variation in the potential of the device region 12 produces a change in operating characteristic of an electric circuit in which the semiconductor device 10 has been incorporated, a stable operating characteristic to the electric circuit is provided owing to the reduction or elimination of the parasitic resistance.

Figure 2A:
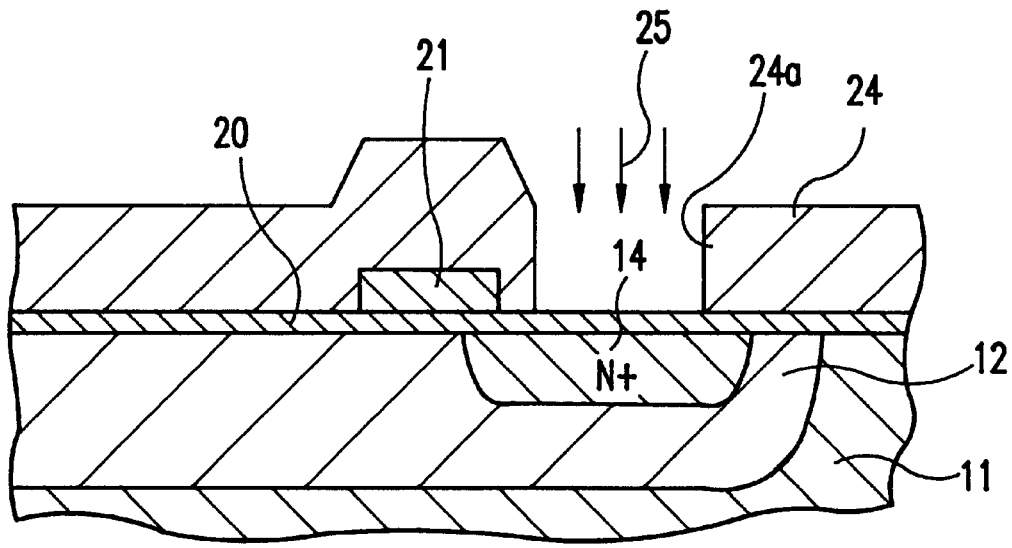
Figure 2B:
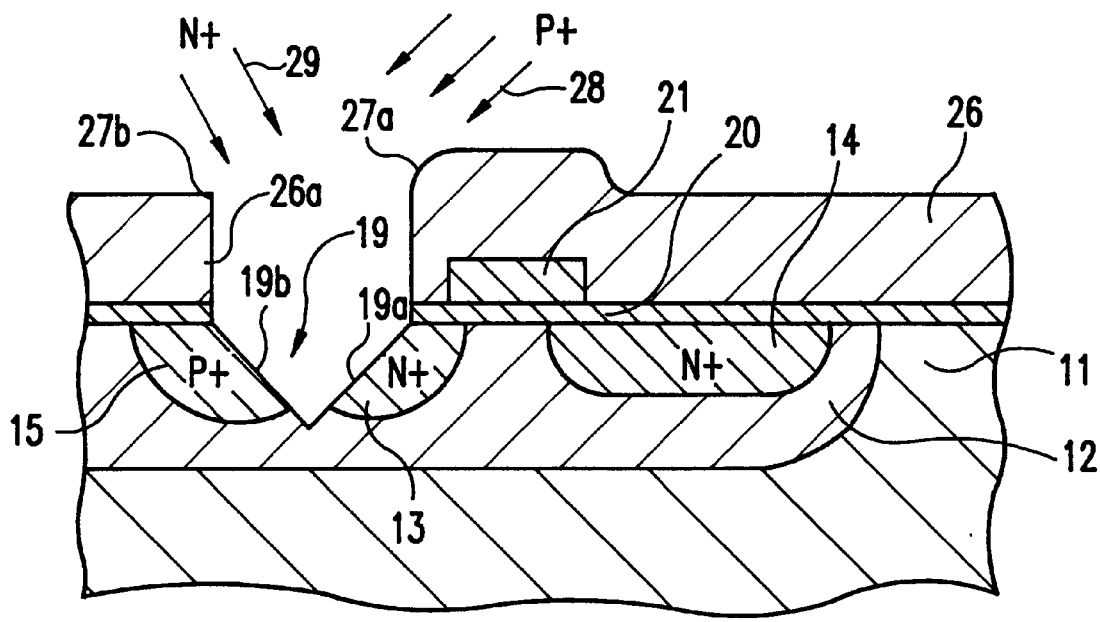

FIGS. 2(a) and 2(b) show one embodiment of a method of manufacturing the NMOS transistor 10 shown in FIG. 1.

As shown in FIG. 2(a), a P well 12 is formed in a semiconductor substrate 11 by, for example, ion implantation and heat treatment in the same manner as previous.

Further, a gate oxide film 20 and a gate 21 are formed on an exposed surface of the P well 12 of the semiconductor substrate 11 by, for example, a CVD process and a photolitho/etching technique similar to those employed in the prior art.

A first mask 24 having an aperture or opening 24a is formed on the semiconductor substrate 11 to form a drain 14 associated with the gate 21. An impurity such as phosphorous or the like, which serves as donors, is ionized and injected or introduced into a predetermined place of the P well 12 using the mask 24, as indicated by arrow designated at numeral 25.

Owing to the injection of the impurity, an impurity-implanted region (14) used for the drain 14 is formed and the first mask 24 is thereafter removed.

After the removal of the first mask 24, a second mask 26 is formed anew on the semiconductor substrate 11 as shown in FIG. 2(b). An aperture or opening 26a for opening or leaving a predetermined region of the P well 12 open is defined in the mask 26. A concave portion 19 is defined in the surface of the predetermined region of the P well 12 by selective etching using the mask 26 with the opening 26a defined therein.

The concave portion 19 can be formed by etching using an anisotropic etchant, for example. When the surface of the semiconductor substrate 11 is of a (100) surface, the peripheral wall portions 19a and 19b can be formed by (111) surfaces each forming an angle of 45° to the (100) surface.

Each of the masks 24 and 26 is used upon the conventional ion implantation and etching and can be formed of a conventionally well-known silicon oxide film formed by, for example, the CVD process and the photolitho/etching.

The peripheral wall portions (19a and 19b) of the concave portion 19 are exposed from the opening 26a of the mask 26 as portions of the surface of the device region 12. Impurities that serve as acceptors and donors, are respectively implanted into the peripheral wall portions 19a and 19b of the concave portions 19 as one half and the other half of the surface exposed toward the opening 26a by ion implantation.

Namely, for example, boron that serves as acceptors, is ionized and applied to the peripheral wall portion 19b extending downward diagonally as viewed on the left side from above as viewed on the right side of the opening 26a shown in FIG. 2(b). Since, at this time, a right edge portion 27a of the opening 26a reliably prevents the divergence of irradiation ions 28 toward the peripheral wall portion 19a located on the right side as viewed in the drawing, the boron serving as the acceptors is prevented from being injected into the peripheral wall portion 19a. Thus, an ion-implanted region (15) used for the electrode withdrawal portion 15 can be reliably formed in the peripheral wall portion 19b.

Further, an impurity serving as donors, which is similar to that used for the drain 14, is ionized and applied to the peripheral wall portion 19a extending downward diagonally as viewed on the right side from above as viewed on the left side of the opening 26a shown in FIG. 2(b). Since, at this time, a left edge portion 27b of the opening 26a reliably prevents the divergence of irradiation ions 29 toward the peripheral wall portion 19b located on the left side as viewed in the drawing, the impurity serving as the donors is prevented from being injected into the peripheral wall portion 19b. Thus, an ion-implanted region (13) used for the source 13 can be reliably formed in the peripheral wall portion 19a.

Although the ions can be individually injected into the peripheral wall portions 19a and 19b of the concave portion 19, they may preferably be injected therein simultaneously each other from the viewpoint of an improvement in working efficiency.

The semiconductor substrate 11 is subjected to heat treatment to activate the impurities in the respective ion-implanted regions (13,14 and 15). The impurities in the respective ion-implanted regions (13, 14 and 15) are activated by this heat treatment, so that the source 13, the drain 14 and the electrode withdrawal portion 15 are formed.

After the activation of the impurities, the mask 26 is removed and the insulating film 16 shown in FIG. 1 is formed in place of the mask 26. Thereafter, the drain electrode 18 connected to the drain 14 through the contact hole 17 defined in the insulating film 16, and the combined electrode 23 connected to the peripheral wall portions 19a and 19b of the concave portion 19 through the contact hole 22 defined in the insulating film 16 are formed by, for example, sputtering well known per se in the art.

Upon forming the electrode withdrawal portion 15 and the source 13 adjacent thereto as described above, the impurity-implanted region for the electrode withdrawal portion 15 of the device region 12 and the impurity-implanted region for the source 13 adjacent thereto can be accurately and efficiently formed by ion implantation made from the slanting directions opposed to each other, using the single mask 26 having the opening 26a defined in the device region 12 of the semiconductor substrate 11.

Thus, since the electrode withdrawal portion 15 and the source 13 adjacent thereto can be easily and efficiently formed by heat treatment for activating these impurities, the semiconductor device 10 according to the present invention can be fabricated at a comparatively low cost and with ease and efficiency.

The specific embodiment shown in FIG. 2 has described a case in which the concave portion 19 is defined in the P well 12, and the source 13 and the electrode withdrawal portion 15 are formed in the peripheral wall portions 19a and 19b of the concave portion 19, respectively.

Figure 3:
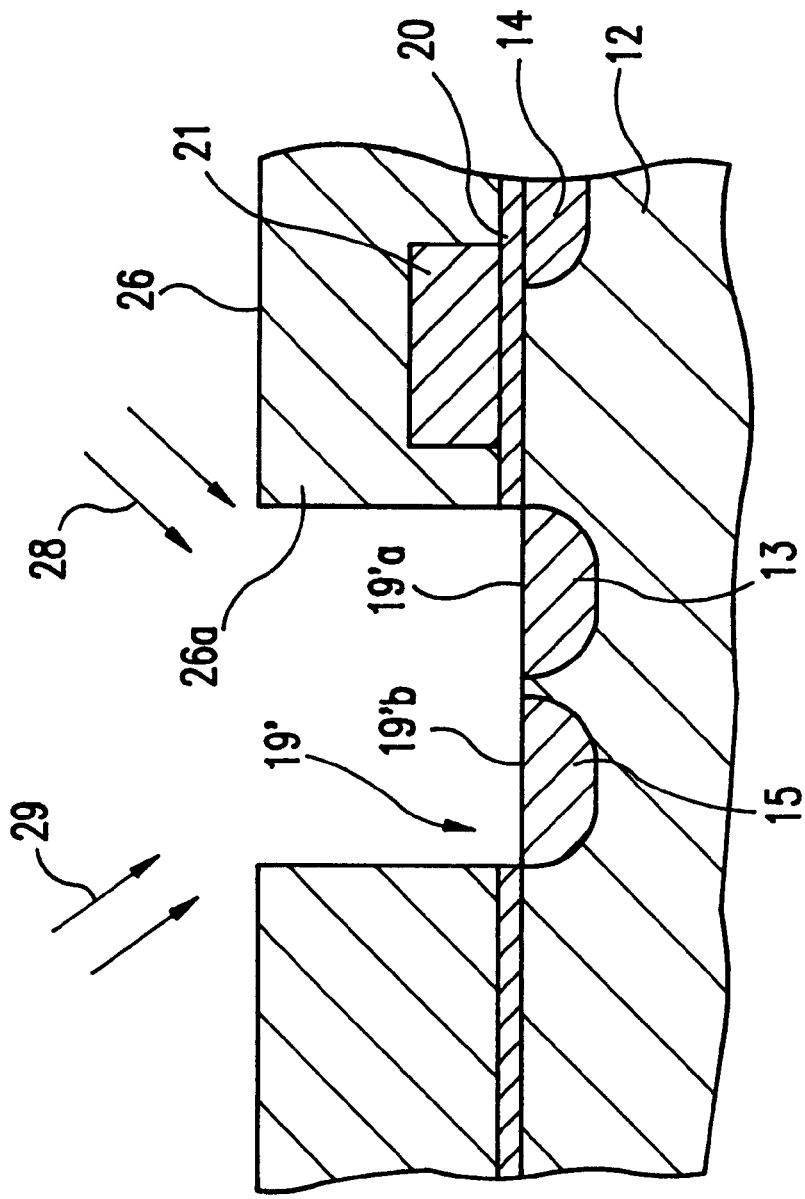
FIG. 3 is a view similar to FIG. 2(b), showing ion implanting processes according to another manufacturing method of the present invention.

As an alternative to the present embodiment, a source 13 and an electrode withdrawal portion 15 can be formed in one half 19'a and the other half 19'b of a flat surface portion 19' of a P well 12 exposed from an aperture or opening 26a defined in a mask 26 as shown in FIG. 3 without defining the concave portion 19 in the P well 12.

The same ion implantation as that described by reference to FIG. 2 can be adopted for the implantation of impurities into the one half 19'a and the other half 19'b of the flat surface portion 19'.

Figure 4:
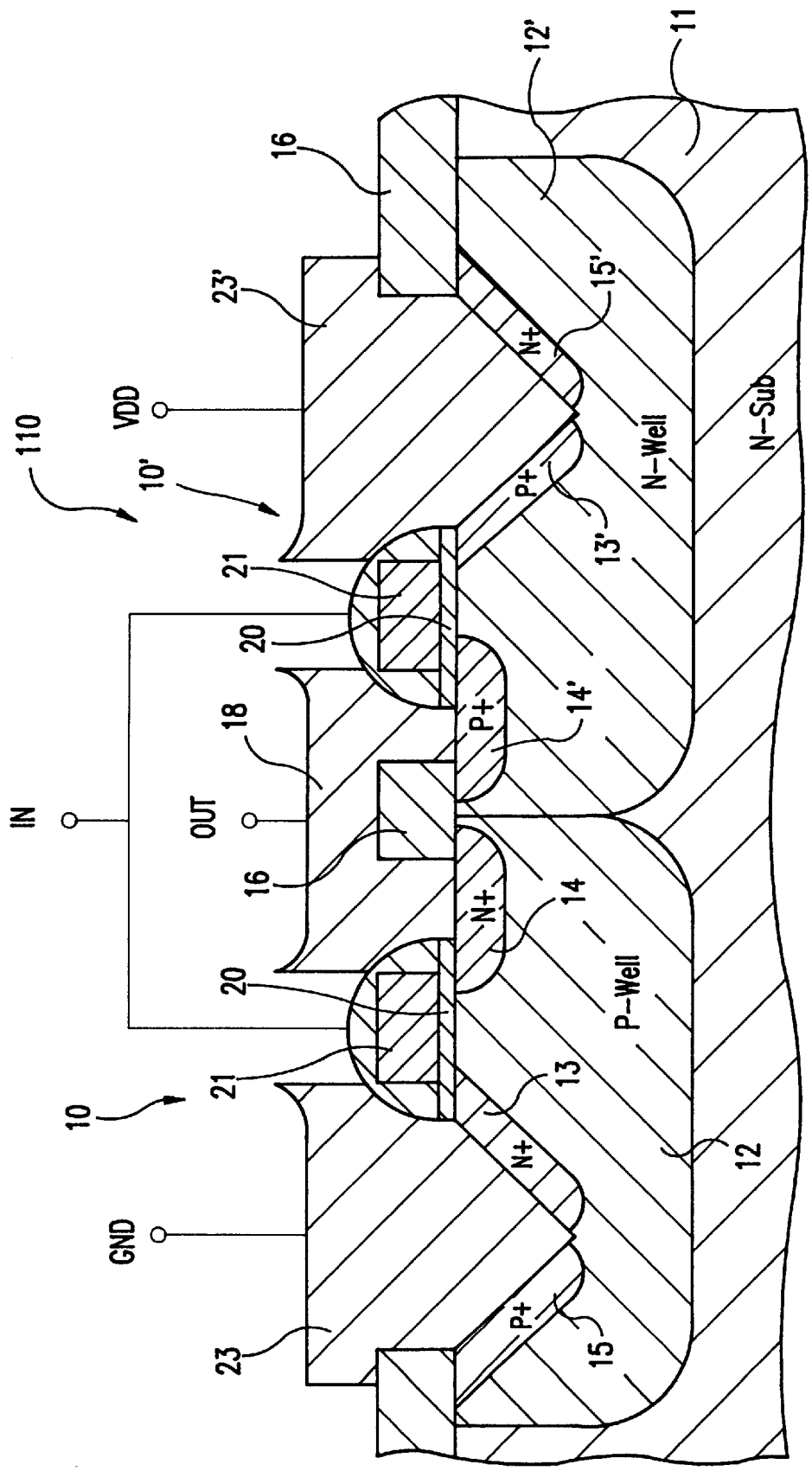
FIG. 4 is a partially longitudinal cross-sectional view of a CMOS inverter showing an embodiment to which a semiconductor device according to the present invention is applied.

FIG. 4 shows a semiconductor device 110 composed of a MOS inverter formed by a combination of MOS transistors-transistors according to the present invention. Of the components shown in FIG. 3, components, which perform the same function as the semiconductor device 10 shown in FIG. 1, are identified by the same reference numerals.

In the semiconductor device 110 shown in FIG. 4, NMOS transistor and PMOS transistor 10 and 10' are respectively formed in two element or device regions composed of a P well 12 and an N well 12' formed on a semiconductor substrate 11.

An NMOS transistor 10 similar to one described above is formed in the P well 12, whereas a PMOS transistor 10' is formed in the N well 12'.

The NMOS transistor 10 formed in the P well 12 is similar to that shown in FIG. 1. However, in the PMOS transistor 10' formed in the P well 12', each of a source 13' and a drain 14' is composed of a P type diffusion region and an electrode withdrawal portion 15' is composed of an N type diffusion region. Further, a combined electrode 23' shared between the source 13' and the electrode withdrawal portion 15' is formed in the PMOS transistor 10'.

In the two MOS transistors 10 and 10', a combined electrode 23 of the NMOS transistor 10 is grounded and a source voltage VDD is applied to the combined electrode 23' of the PMOS transistor 10' to constitute an inverter composed of CMOS transistors well known in the art. Further, a gate voltage is applied to each of gates 21 of the MOS transistors 10 and 10' as an input signal and an output signal is drawn from a drain electrode 18 shared between both drains 14 and 14'.

Figure 5A:
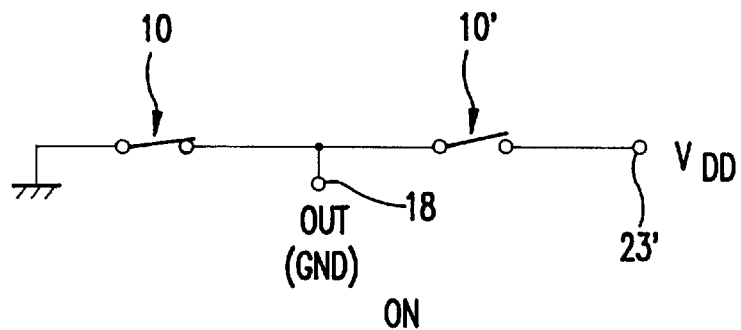
FIG. 5(a) is a circuit diagram showing the turning on of a gate input signal.
Figure 5B:
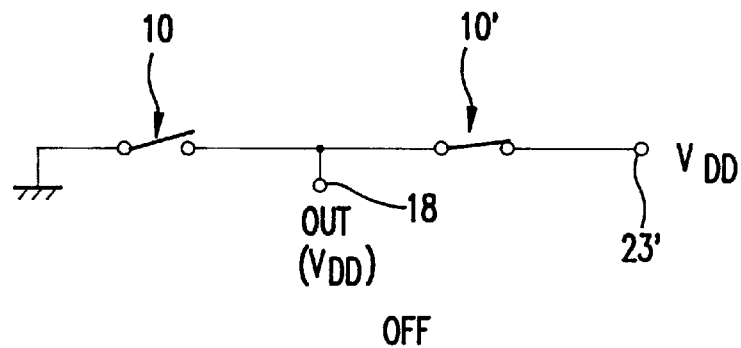
FIG. 5(b) is a circuit diagram illustrating the turning off of the gate input signal.

FIGS. 5(a) and 5(b) show a circuit diagram of the inverter 110 shown in FIG. 4, wherein FIG. 5(a) illustrates a circuit state in which a gate input is in an off state, i.e., the gate voltage is a ground voltage, and FIG. 5(b) depicts a circuit state in which the gate voltage is in an on state.

When, for example, a source voltage $V_{DD}$ corresponding to a predetermined applied voltage is inputted to the gate 21 as an input signal, a channel is formed between the source 13 and drain 14 of the NMOS transistor 10 in this gate-input on state as is well known in the art. Therefore, the NMOS transistor 10 is held in conduction as shown in FIG. 5(a).

On the other hand, since the difference in potential between the source 13' and gate 21 of the PMOS transistor 10' reaches zero, no channel is formed between the source 13' and drain 14' of the PMOS transistor 10'. Thus, the PMOS transistor 10' is held in non-conduction as shown in FIG. 5(a).

As a result, the ground potential is outputted to an output terminal (18) of the drain electrode 18.

When the ground voltage is applied to the gate 21 as an input signal, no channel is formed between the source 13 and drain 14 of the NMOS transistor 10 in this gate-input off state as is well known in the art. Therefore, the NMOS transistor 10 is held in a cut-off state whereas the PMOS transistor 10' is held in conduction, as shown in FIG. 5(b).

As a result, the source voltage $V_{DD}$ is outputted to the output terminal (18) of the drain electrode 18 as shown in FIG. 5(b).

Thus, the semiconductor device 110 can take out a value obtained by inverting the input signal, as an output signal in a manner similar to the conventional inverter.

According to the semiconductor device 110, the sources 13 and 13' and electrode withdrawal portions 15 and 15' of the respective MOS transistors 10 and 10' share the use of their corresponding combined electrodes 23 and 23'. It is therefore unnecessary to provide the electrodes dedicated to the electrode withdrawal portions 15 and 15'. Thus, the areas of the P well 12 and N well 12' serving as the device regions can be reduced. As a result, the semiconductor device can be compacted.

According to the semiconductor device 110 as well, since the intervals W between the sources 13 and 13' of the MOS transistors 10 and 10' and the electrode withdrawal portions 15 and 15' thereof are shortened, the parasitic resistances between the source 13 and the electrode withdrawal portion 15 and between the source 13' and the electrode withdrawal portion 15' can be reduced and a latch-up phenomenon inherent in each CMOS transistor due to the reductions in the parasitic resistances can be effectively prevented from occurring.

A description has been made of the embodiment in which the present invention has been applied to the NMOS transistor and the CMOS transistor formed in the well corresponding to the device region, of the semiconductor substrate. However, the transistor according to the present invention can be formed in a semiconductor substrate having no well.

Further, the present invention can be applied to, for example, a MOSFET for holding a potential applied to a source or drain and a substrate potential equally as well as to a MOS transistor, or various semiconductor devices like inverters composed of their combinations.

According to the semiconductor device of the present invention, the need for the substrate electrode for the device region, which is independent of the respective electrodes for the source or drain, is eliminated as described above. Thus, the device region can be reduced in size owing to its elimination. As a result, the semiconductor device can be rendered compact in size.

According to the method of manufacturing the semiconductor device of the present invention, since the impurity-implanted region for the electrode withdrawal portion of the device region and the impurity-implanted region for the source or drain adjacent thereto are formed by ion implantation made from the slanting directions opposed to each other, using the single mask having the opening defined in the device region of the semiconductor substrate, the electrode withdrawal portion and the source or drain adjacent thereto can be easily and efficiently formed. Thus, the semiconductor device according to the present invention can be fabricated at low cost and with comparatively ease and efficiency.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:

a source and a drain formed in a device region of a semiconductor substrate, said source and drain being subjected to control of a current flowing therebetween by a gate voltage;

an electrode withdrawal portion for said device region, said electrode withdrawal portion being formed in said device region so as to be adjacent either one of said source and said drain, and said electrode withdrawal portion having a conductivity type which is the same as a conductivity type of said device region and an impurity concentration which is higher than an impurity concentration of said device region; and a common conductive layer contacting said either one of said source and said drain and said electrode withdrawal portion through a same contact hole formed in an insulating layer on a principal surface of said semiconductor substrate, wherein a distance between said electrode withdrawal portion and said either one of said source and drain, which is formed adjacent to said electrode withdrawal portion, is less than 2μm.

2. A semiconductor device comprising:

a semiconductor substrate of a first conductivity type;

a well of a second conductivity type formed in a surface of said semiconductor substrate;

a transistor structure formed in said well, said transistor structure having spaced apart first and second impurity regions of said first conductivity type, and a control region between said first and second impurity regions, said control region having a control electrode formed thereon;

a third impurity region of said second conductivity type formed in said well, said third impurity region being formed so as to be spaced a predetermined distance from said first impurity region and having an impurity concentration which is higher than an impurity concentration of said well; and a conductive layer formed on said first and third impurity regions within a same contact hole formed in an insulating layer on said surface of said semiconductor substrate, wherein said predetermined distance is less than or equal to 2$\mu$m.

3. A semiconductor device having a structure of an inverter, said structure comprising:

a semiconductor substrate of a first conductivity type;

a first well of a second conductivity type formed in a surface of said semiconductor substrate;

a first transistor structure formed in said first well, said first transistor structure having spaced apart first and second impurity regions of said first conductivity type, and a first control region between said first and second impurity regions, said first control region having a first control electrode formed thereon;

a third impurity region of said second conductivity type formed in said first well, said third impurity region being formed so as to be spaced a first distance from said first impurity region and having an impurity concentration which is higher than an impurity concentration of said first well; and a first conductive layer formed on said first and third impurity regions within a same first contact hole formed in an insulating layer on said surface of said semiconductor substrate;

a second well of said first conductivity type formed in the surface of said semiconductor substrate;

a second transistor structure formed in said second well, said second transistor structure having spaced apart fourth and fifth impurity regions of said second conductivity type, and a second control region between said fourth and fifth impurity regions, said second control region having a second control electrode formed thereon;

a sixth impurity region of said second conductivity type formed in said second well, said sixth impurity region being formed so as to be spaced a second distance from said fourth impurity region and having an impurity concentration which is higher than an impurity concentration of said second well; and a second conductive layer formed on said fourth and sixth impurity regions within a same second contact hole formed in said insulating layer on said surface of said semiconductor substrate;

an input terminal connected to said first and second control electrodes; and an output terminal formed on said second and fifth impurity regions, wherein said second conductive layer is connected with a first potential and said first conductive layer is connected with a second potential which is lower than the first potential, and wherein the first distance between said first and third impurity regions and the second distance between said fourth and sixth impurity regions are less than or equal to 2$\mu$m respectively.

* * * * *